US 6,566,890 B2

(12) United States Patent
Hauptman

(10) Patent No.: US 6,566,890 B2
(45) Date of Patent: May 20, 2003

(54) CIRCUIT FOR IMPROVED TEST AND CALIBRATION IN AUTOMATED TEST EQUIPMENT

(75) Inventor: Steven Hauptman, Camarillo, CA (US)

(73) Assignee: Teradyne, Inc., Boston, MA (US)

( * ) Notice: Subject to any disclaimer, the term of this patent is extended or adjusted under 35 U.S.C. 154(b) by 33 days.

(21) Appl. No.: 09/798,515

(22) Filed: Mar. 2, 2001

(65) Prior Publication Data

US 2002/0121904 A1 Sep. 5, 2002

(51) Int. Cl.$^7$ ............................................. G01R 35/00
(52) U.S. Cl. ...................................... 324/601; 327/415
(58) Field of Search ............................. 324/73.1, 158.1, 324/601, 765; 327/493, 503, 583, 587, 415, 416

(56) References Cited

U.S. PATENT DOCUMENTS

| | | | | |
|---|---|---|---|---|
| 4,249,150 A | * | 2/1981 | Bickley et al. ............. | 333/262 |
| 4,251,742 A | * | 2/1981 | Beelitz ........................ | 307/270 |
| 4,629,906 A | * | 12/1986 | Heffner ........................ | 307/80 |
| 4,649,354 A | * | 3/1987 | Khanna ........................ | 331/99 |
| 4,825,081 A | * | 4/1989 | Wille et al. .................. | 250/551 |
| 5,578,932 A | * | 11/1996 | Adamian .................... | 324/601 |
| 6,229,412 B1 | * | 5/2001 | Delzer ........................ | 333/262 |

OTHER PUBLICATIONS

"An Individualized Pulse/Word Generator for Subnanosecond Testing"; Christian Hentschel, et al; HP Journal; Aug. 1977; p. 16–23.

* cited by examiner

*Primary Examiner*—Christine Oda
*Assistant Examiner*—Etienne P LeRoux
(74) *Attorney, Agent, or Firm*—Lance M. Kreisman

(57) ABSTRACT

In at least one embodiment, a circuit for a multi-channel tester having a central resource, a plurality of outputs, and a switching matrix coupling the central resource to the plurality of outputs via a plurality of selectable channels. Each of the selectable channels having PIN diodes coupled in a half-bridge configuration. A first, a second, and a third biasing source for forward biasing the PIN diodes. The first and second biasing sources are coupled to a central resource coupled end and an output coupled end of the half-bridge, respectively. The third biasing source is coupled to a common node. The first and second biasing sources are constructed to provide substantially balanced outputs and such that the sum of the outputs of the first and second biasing sources are substantially balanced with respect to the output of the third bias source. In some embodiments, a the plurality of selectable channels comprises the same first biasing source. In some embodiments, each of the plurality of channels comprises a different second biasing source. In some embodiments, pin electronics drivers can be used as the second biasing source. In some embodiments, a single third biasing source can be coupled to each of the common nodes of the plurality of selectable channels via one of a plurality of switches. In some embodiments, the PIN diodes can be located near the central resource end of the channel and near the output pin end of the channel allowing cleaner more accurate voltage/timing measurements.

38 Claims, 5 Drawing Sheets

CIRCUIT FOR IMPROVED TEST AND CALIBRATION IN AUTOMATED TEST EQUIPMENT

BACKGROUND

Automatic test equipment or ATE is used to test semiconductor or other type devices at various stages of manufacture. An ATE tester generates signals, supplies the signals to selected pins of a device under test or DUT, and monitors the responses to these signals to evaluate the fitness of the DUT. These signals include DC signals, and time varying signals such as AC, pulsed, or other periodic signals.

To provide these signals with precision to each of the selected pins, a single central resource, such as an oscillator, pulse generator, sine wave generator, etc., is used. The signal provided by such central resource is switched along a selected channel to a pin under test.

In the past, this was accomplished using a relay matrix configured in a binary tree structure as shown in FIG. 1. FIG. 1 illustrates two state form-C relays, capable of providing signals to one of two outputs. In the binary tree configuration of FIG. 3, a form C-relay R1 has an input connected to the central resource and two outputs each connected to inputs of two form-C relays, R21 and R22. R21 and R22 are in turn are each connected in similar fashion to relays R31–R34 of layer R3. In the illustration of FIG. 1, this pattern is repeated for several layers R1–R7 of relays to provide selectable signal channels to 128 output pins.

Although this configuration provides several advantages, there are several drawbacks associated with the use of relays as discussed in U.S. Pat. No. 6,331,783 by Steven Hauptman, filed on Oct. 19, 1999, entitled CIRCUIT AND METHOD FOR IMPROVED TEST AND CALIBRATION IN AUTOMATED TEST EQUIPMENT, issued on Dec. 18, 2001, herein incorporated by reference in its entirety.

A significant drawback is that relays is that polymer can build up on the surface of the relay contacts. Contacts are susceptible to polymer build-up when switched dry rather than under an applied current or voltage. Such polymer build-up increases contact resistance. Moreover, the resistance caused by polymer build-up varies each time the contacts are closed. This is particularly true in relays designed for high bandwidth applications. In such applications, relays having small contacts to provide lower capacitance along the high frequency transmission line also have a reduced spring force, which facilitates resistance variations in polymerized contacts. In testers designed to test devices 125 Mhz–500 Mhz or greater, relays normally having only a fraction of an ohm resistance, can develop several ohms of resistance. This results in each closure of the relay leading to a different resistance value, which affects measurement precision and, consequently, the reliability of the tester. As such, relays contribute to tester down time, slowing production and reducing product margins. To compete in semiconductor and other electronic devices markets, manufacturers require more reliable test equipment.

Another drawback of that the binary relay tree configuration is that it requires a large number of relatively large sized relays. To go from one resource to N output pins requires N–1 relays. With 128 pins, seven relays are present in the transmission channel. Due to their size, the relays must be spread across the circuit board resulting in location of the relays along the transmission channel rather than close to the ends. This causes a skin effect problem resulting in signal transitions to be less defined. Such a degraded signal can cause inaccuracy during signal calibration and test measurements.

What is needed is a reliable circuit for accurate testing in a multi-channel tester.

SUMMARY

In at least one embodiment, a circuit for a multi-channel tester having a central resource, a plurality of outputs, and a switching matrix coupling the central resource to the plurality of outputs via a plurality of selectable channels. Each of the selectable channels having PIN diodes coupled in a half-bridge configuration. A first, a second, and a third biasing source are provided for forward biasing the PIN diodes. The first and second biasing sources are coupled to a central resource coupled end and an output coupled end of the half-bridge, respectively. The third biasing source is coupled to a common node. The first and second biasing sources are constructed to provide substantially balanced outputs and so that the sum of the outputs of the first and second biasing sources is substantially balanced with respect to the output of the third bias source.

In one embodiment, a the plurality of selectable channels comprises the same first biasing source. Further, in some embodiments, each of the plurality of channels comprises a different second biasing source. In some embodiments, pin electronics drivers are used as second biasing sources. In further embodiments, a single third biasing source is coupled to each of the common nodes of the plurality of selectable channels via one of a plurality of switches.

It is possible in some embodiments, to locate the PIN diodes near the central resource end of the channel and near the output pin end of the channel allowing cleaner more accurate voltage/timing measurements.

DETAILED DESCRIPTION

Figure 1:
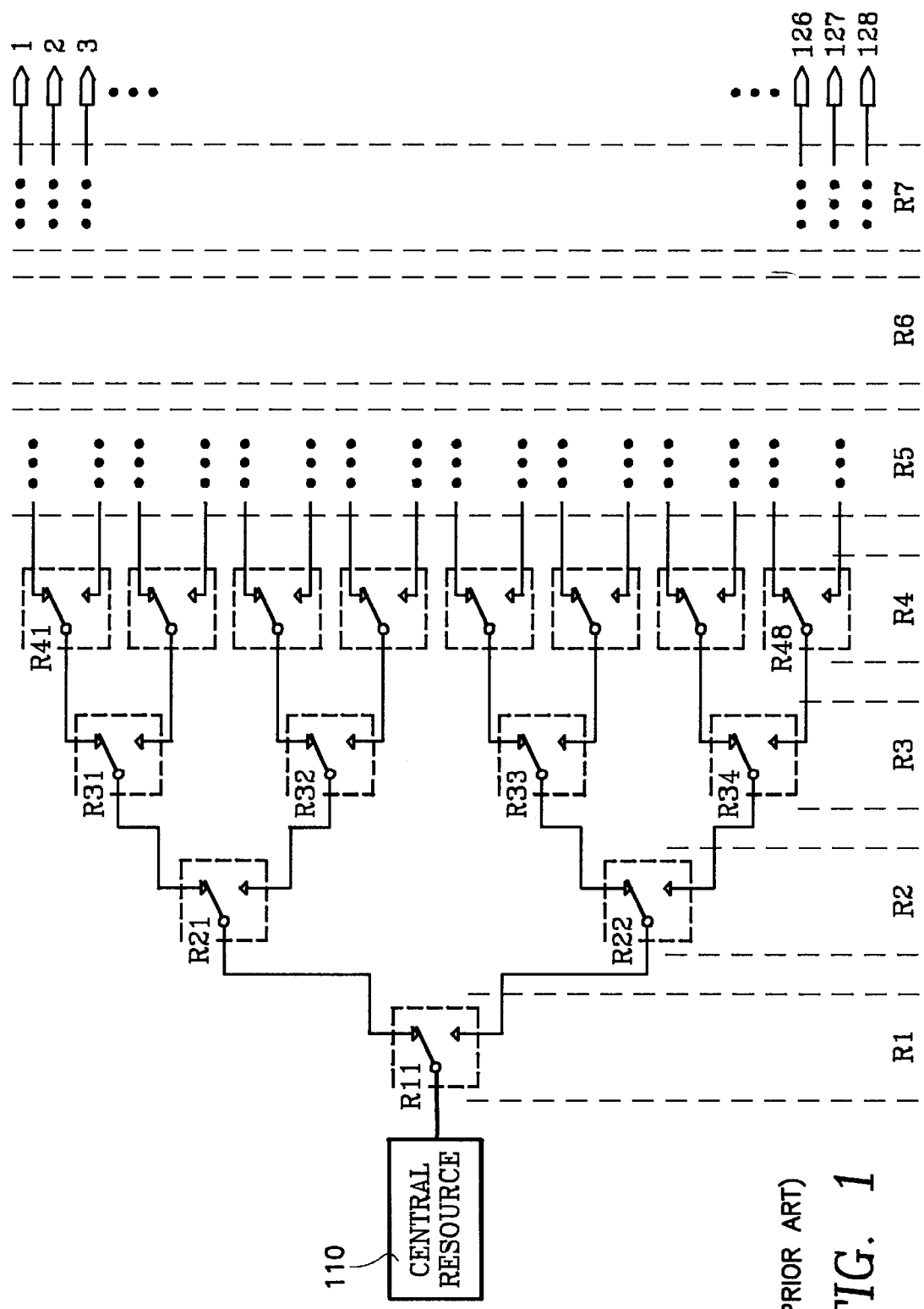
FIG. 1 shows a prior art binary tree relay matrix.
Figure 2:
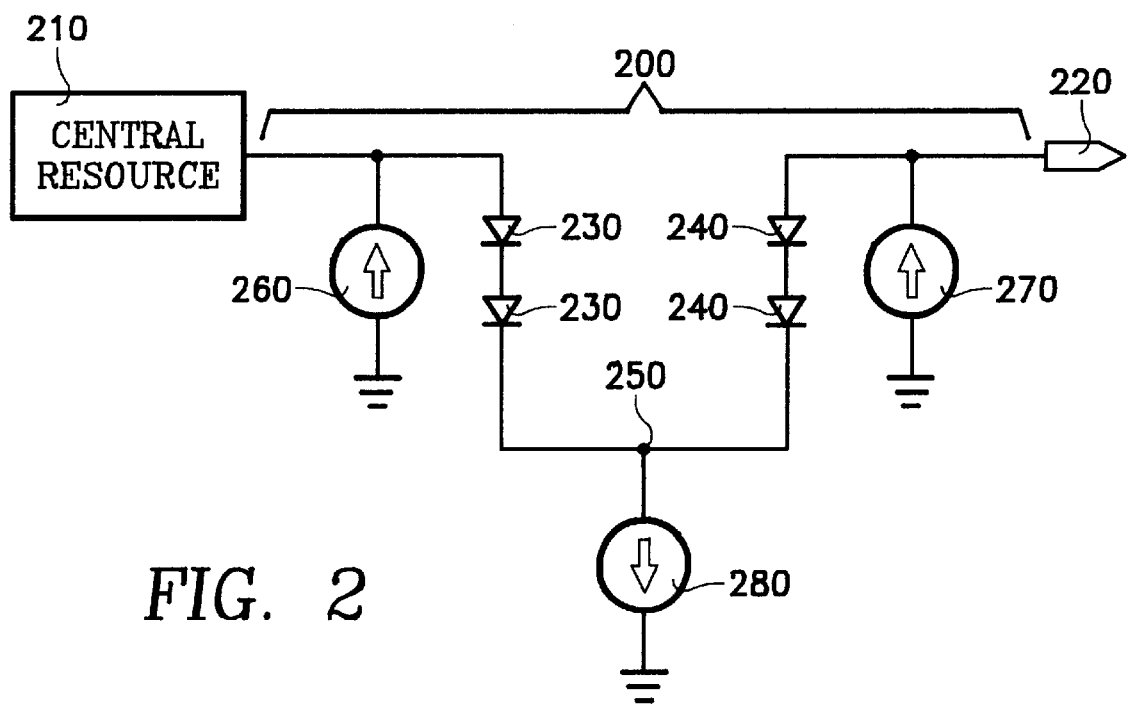
FIG. 2 shows a single series connected transmission channel in accordance with the present invention.

FIG. 2 shows a single series connected transmission channel 200 extending from a resource 210 to an output pin 220. PIN diodes 230 and 240 are connected in a half-bridge configuration with diodes 230 and 240 forward facing, in this illustration, toward a common node 250. First, second, and third bias sources 260, 270, and 280 respectively, are used to DC bias the PIN diodes 230 and 240. The first and second bias sources 260 and 270 are coupled to either end of the half-bridge with a third bias source 280 being provided at the common node 250 of the half-bridge.

In the embodiment illustrated in FIG. 2, the first, second, and third bias sources are current sources. Under ideal conditions, the first, second, and third current sources 260, 270, and 280, respectively, are balanced such the first and second current sources 260 and 270 each provide one-half of the current of the third current source 280. Under non-ideal conditions, match resistors (not shown) can be employed to balance the biasing sources. With the PIN diodes 230 and 240 forward biased, signals may be transmitted along the channel 200. In general, the biasing must be sufficient so that the signal transmitted along the channel does not turn the diodes of that channel off.

Figure 3:
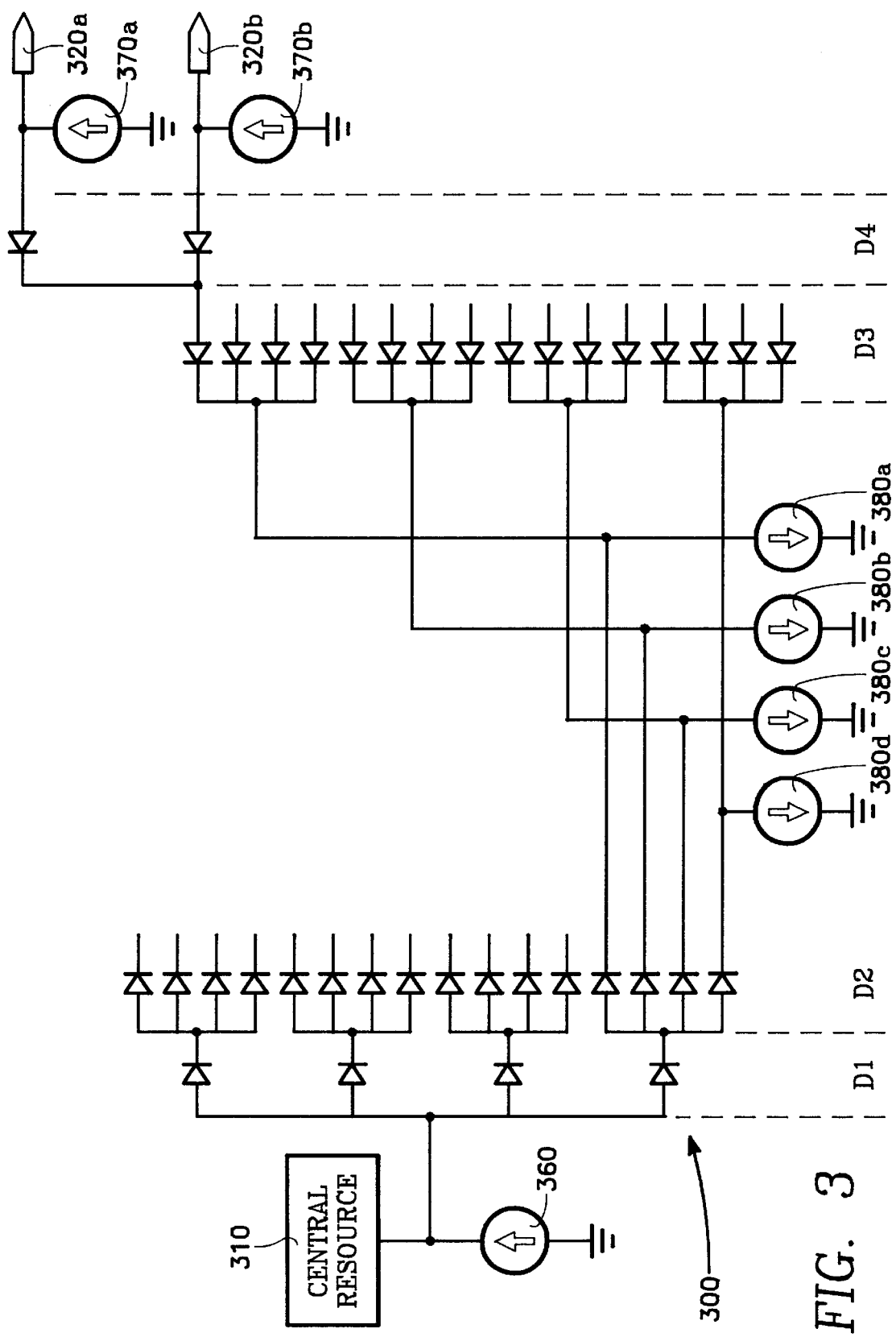
FIG. 3 shows a switching circuit in accordance with an embodiment of the present invention.

FIG. 3 illustrates a switching matrix 300 for routing signals from a central resource 310 to a selected one of 128 output pins 320. In this embodiment, to provide selective routing between the central resource 310 and a selected one of the output pins 320, four levels of PIN diodes D1–D4 are provided.

In the D1 level, four PIN diodes are coupled in parallel to the central resource 310. At the D2 level are four groups of four parallel coupled PIN diodes. Each of the D2 groups of PIN diodes are coupled in series to a different one of the D1 level PIN diodes.

At the D3 level are sixteen groups (not all shown) of four parallel coupled PIN diodes. In FIG. 3, only four of the sixteen groups are shown. Each of the D3 level PIN diodes are coupled in series to a different one of the D2 level PIN diodes. The D4 level has sixty-four groups (not all shown) of parallel coupled diodes series connected to each of the PIN diodes of the D3 level. In FIG. 3 only one of the sixty-four groups is shown. In the embodiment shown in FIG. 3, two PIN diodes are provided in each group of the D4 level to provide a 128 pin output.

With the embodiment illustrated in FIG. 3, a single first current source 360 is connected near the central resource end of the switching matrix 300. A separate second current source 370 is connected near each of the output pins 320. In the embodiment illustrated in FIG. 3, separate third current sources 380 are connected to each D2 level diode between the D2 and D3 level diodes.

The signals may be communicated to/from one of the pins 320 by activating the first current source 360 in conjunction with the appropriate second and third current sources 370 and 380. For example, a channel from the central resource 310 to output pin 370a can be formed by activating second current source 370a and third current source 380a.

Figure 4:
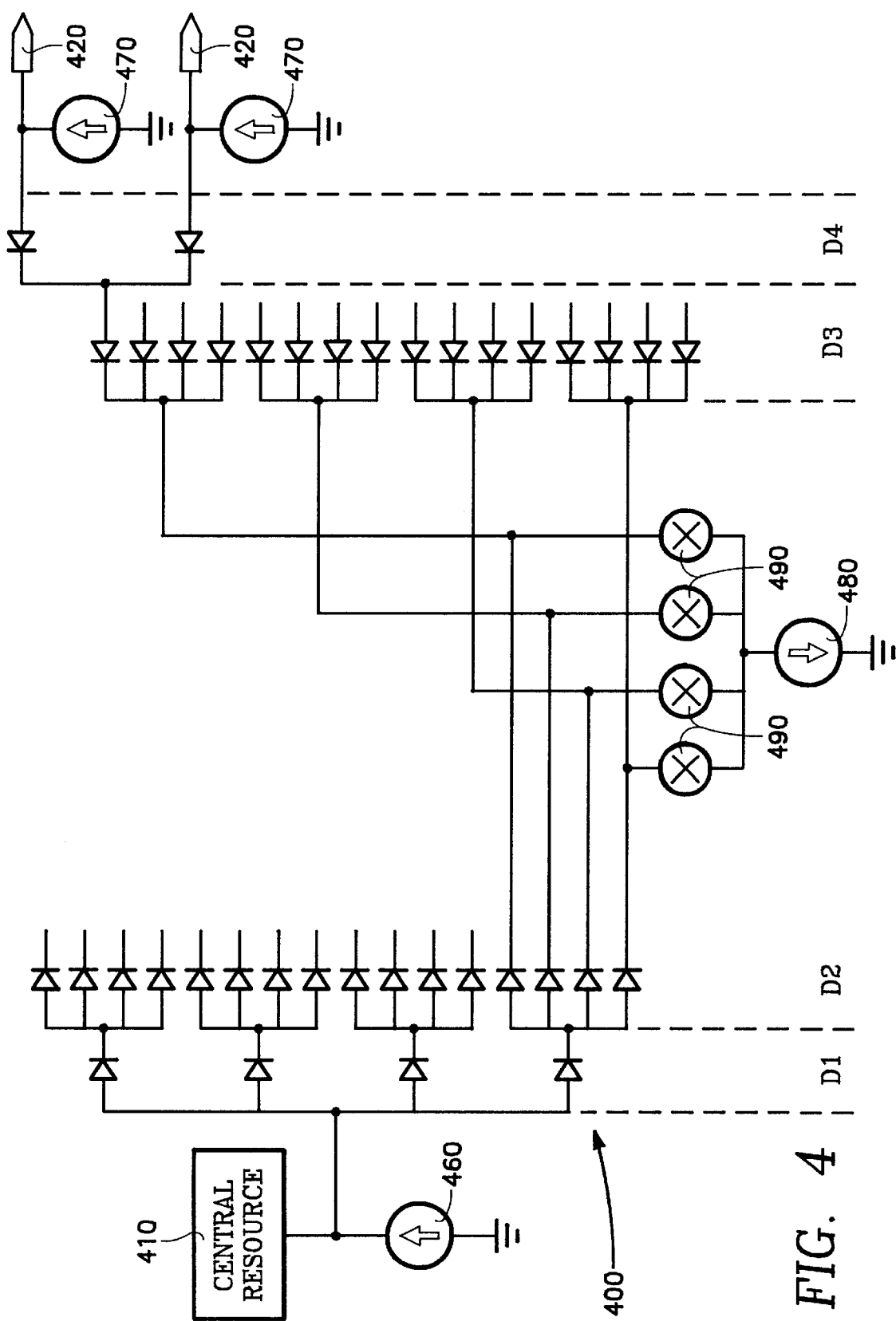
FIG. 4 shows a switching circuit in accordance with an embodiment of the present invention.

FIG. 4 illustrates an embodiment employing a singe third current source 480 coupled via switches 490 to each of the D2 level diodes between each D2 level diode and each group of D3 level diodes. The switches 490 may be solid state switches, such a field effect transistor devices. As there is a single third current source 480, this embodiment reduces the number of current sources require to operate the switching matrix. In the embodiment of FIG. 4, a single first current source 460 coupled near the central resource end of the switching matrix 400 provides a bias source, while at the pin end of the matrix 400, separate current sources 470 are coupled near each of the output pins 420.

Figure 5:
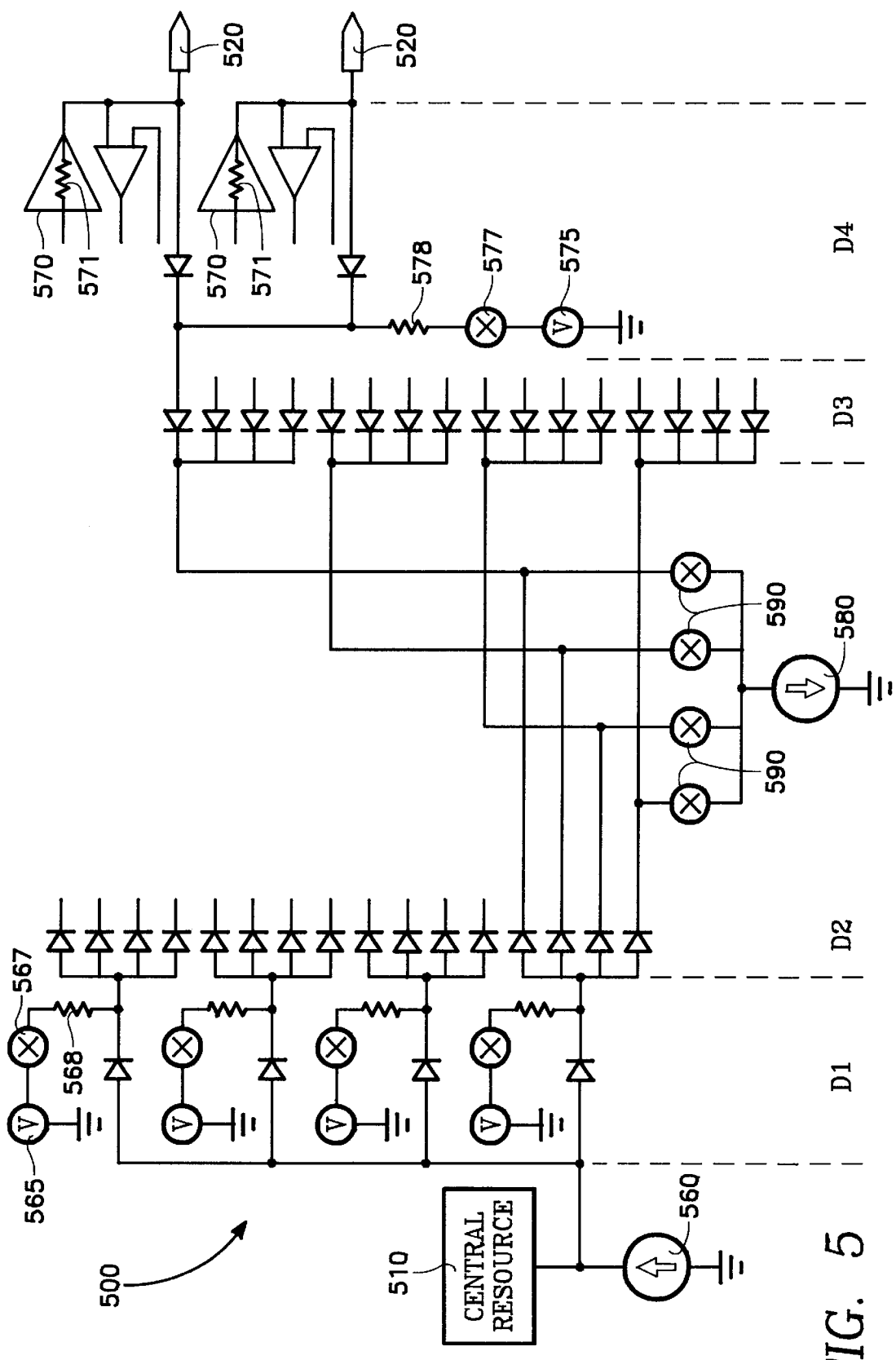
FIG. 5 shows a switching circuit in accordance with an embodiment of the present invention.

Turning to FIG. 5, in accordance with Thevenin's and Norton's theorems, voltage drivers with series resistors may be employed as any of the biasing sources. As such, pin electronics voltage drivers 570 with series backmatch resistors 571, which are conveniently located near the output pins 520, may be employed as the second biasing source. Typically, about 50 ohm backmatch resistors are employed.

Typically, biasing of the channel will result in DC offsets to showing up. If the half-bridge is not perfectly balanced, however, an offset can be applied to compensate. For example, before sending a signal pulse along the channel, the low and high voltage levels are measured at the central resource end and at the output pin end of the channel with a calibration circuit. A calibration circuit such as disclosed in above referenced U.S. Pat. application Ser. No. 09/420, 497 by Steven Hauptman, incorporated by reference, may be provided for this purpose on each channel. A pin electronics driver 570 with backmatch resistor 571 may be employed to apply the proper compensation offset required to balance the half-bridge.

Additional biasing sources may be employed to reverse bias non-transmission channel diodes if desired to reduce transmission channel capacitance. One or more biasing sources 565 can be employed to reverse bias the diodes of the D1 level that do not form part of a selected transmission channel. Likewise, one or more biasing sources 575 can be employed to reverse bias groups of D4 level diodes that do not form part of the selected transmission channel.

As illustrated in FIG. 5, each D1 reverse biasing source 565 is shown coupled via switch 567 and an isolation resistor 568 to the transmission channel between a D1 level diode and a group of D2 level diodes. Each D4 reverse biasing source 575 is shown coupled via switch 577 and an isolation resistor 578 to the transmission channel between a D3 level diode and a group of D4 level diode. 10 k ohm isolation resistors 568 and 578 with positive voltages, such as about 10 volts, may be used for reverse biasing the D1 and D4 diodes.

In addition, the pin electronics drivers 570 conveniently may be used as reverse biasing sources for the associated diode of the D4 level. For example, in the illustration of FIG. 5, one of the pin electronics drivers 570, may provide a reverse bias, while the other of the pin electronics drivers 570 may operate as a forwarding bias source in conjunction with current sources 560 and 580 as discussed above.

Employing PIN diodes in the matrix configuration illustrated in FIGS. 3–5 has several advantages. It allows fewer levels of dioides. The PIN diode matrix of FIGS. 3–5 allows four levels of diodes for 128 or even 256 output pins, as opposed to seven and eight layers of relays for 128 and 256 pins, respectively. This is possible because PIN diodes have low lumped capacitance in the off state. Low lumped capacitance allows a plurality of PIN diodes to be grouped in parallel with the transmission channel. The off capacitance of PIN diodes is about 0.2 pf each. Thus, three off PIN diodes, for example, presents about 0.6 pf capacitance on the transmission channel. In contrast, a plurality of open relays in parallel present a prohibitively larger lumped capacitance on the transmission channel.

In comparison to other diodes, such as normal silicon PN junction diodes and hot carrier or Schottkey P-metal junction diodes, PIN diodes have both a low resistance in the open state (under high bias) and a low capacitance in the off state. Low capacitance in the off state combined with low resistance in the on state allows several diodes to be coupled in parallel along the transmission channel while not impacting the high frequency bandwidth of the transmission channel. As such, the use of PIN diodes allows the switching matrix of FIGS. 3–5 to provide greater bandwidth for high frequency signals.

A further advantage is that PIN diodes are small in size. Whereas the dimension of a form-C relay is on the order of about 9×14 mm, a PIN diode, such as a SOT-23 manufactured by Agilent Corp. located in Palo Alto, Calif., has dimensions on the order of about 2.6×3.1 mm. This, in combination with fewer levels, allows placement of some PIN diodes physically near the common resource 310 and some PIN diodes physically near to the respective output pin 320 rather than physically spread along the transmission channel as is the case the binary relay tree. Placement of the diodes in this manner results in diode losses appearing, for timing purposes, as part of the forward biasing source, i.e. as part of the backmatch resistor. This reduces the skin effect problem dramatically, and allows cleaner more accurate voltage/timing measurements. This is of particular importance during calibration.

As such, in some embodiments, to provide cleaner more accurate voltage/timing measurements, half of the diodes of switching matrix are located near the central resource, while the other half of the diodes of the switching matrix are located near the pins. In such embodiments, the switching matrix is physically divided into two locations within the tester.

It is also possible in some embodiments, if desired, to employ the PIN diode matrix to simultaneously supply/receive signals from/at a single central resource to/from multiple output pins. This is not possible with the binary relay tree.

Although illustrated with a 128 pin output, some embodiments of the present invention are not limited to 128 pins. It is contemplated that some embodiments may provide coupling from the central resource to a greater number of pins. In one embodiment, an equal number of diode voltage drops may be provided on either side of the half-bridge, for example six diodes are located in each channel, with three diodes on either side of the common node of each channel. Thus, in such an embodiment, there are more levels of diodes.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. A circuit for a multi-channel tester comprising:
    a) a central resource;
    b) a plurality of outputs; and
    c) a switching matrix coupling the central resource to the plurality of outputs via a plurality of selectable channels, each of the channels comprising:
        (i) PIN diodes coupled in a half-bridge configuration having a central resource coupled end, an output coupled end, and a common node; and
        (ii) a first, a second, and a third biasing source for forward biasing the PIN diodes, the first and second biasing sources being coupled to the central resource coupled end and the output coupled end of the half-bridge, respectively, the third biasing source being coupled to the common node, the first and second biasing sources being constructed to provide substantially balanced outputs and such that the sum of the outputs of the first and second biasing sources are substantially balanced with respect to the output of the third bias source.

2. The circuit of claim 1 wherein a selectable channel comprises:
    a) at least two series connected PIN diodes coupled to the central resource adjacent the central resource; and
    b) at least two series connected PIN diodes coupled adjacent the output coupled end of the selected channel.

3. The circuit of claim 1 wherein each of the plurality of channels comprises the same first biasing source.

4. The circuit of claim 3 further comprising a plurality of second biasing sources, and wherein each of the plurality of channels comprises a different second biasing source.

5. The circuit of claim 4 wherein the plurality of second biasing sources comprise a pin electronics driver and a backmatch resistor.

6. The circuit of claim 4 wherein each of the second biasing sources is capable of reversing biasing a D4 level diode of a non-selected channel.

7. The circuit of claim 4 further comprising a plurality of switches, and wherein a single third biasing source is coupled to each of the common nodes of the plurality of selectable channels via one of the plurality of switches.

8. The circuit of claim 7 further comprising a plurality of PIN diodes on either side of the common node, and wherein each channel is coupled to the third biasing source.

9. The circuit of claim 8 wherein each PIN diode connected to the common node is coupled to the third biasing source via a switch.

10. The circuit of claim 9 comprising a plurality of PIN diodes on a central resource side of the half-bridge located proximate to the central resource coupled end of the channel, and comprising a plurality of PIN diodes on an output side of the half-bridge located proximate to the output coupled end of the channel.

11. The circuit of claim 9 wherein the switching matrix comprises:
    a) a plurality of PIN diodes comprising a D1 level coupled in parallel to the central resource;
    b) a plurality of PIN diodes comprising a D2 level, the plurality of PIN diodes of the D2 level comprising a plurality of groups comprising parallel coupled PIN diodes, each of the plurality of D1 level diodes being coupled to a different one of the groups of parallel coupled PIN diodes;
    c) a plurality of PIN diodes comprising a D3 level, the plurality of PIN diodes of the D3 level comprising a plurality of groups comprising parallel coupled PIN diodes, each of the plurality of D2 level diodes being coupled to a different one of the groups of parallel coupled PIN diodes of the D3 level; and
    d) a plurality of PIN diodes comprising a D4 level, the plurality of PIN diodes of the D4 level comprising a plurality of groups comprising parallel coupled PIN diodes, each of the plurality of D3 level diodes being coupled to a different one of the groups of parallel coupled PIN diodes of the D4 level.

12. The circuit of claim 11 wherein each of the selectable channels comprise:
    a) a D1 level PIN diode series coupled to a D2 level PIN diode, the series coupled D1 and D2 level PIN diodes being series coupled to the central resource proximate to the central resource; and
    b) a D3 level PIN diode coupled in series to a D4 level PIN diode, the series coupled D1 and D2 level PIN diodes being series coupled to an output pin proximate to an output of the selectable channel.

13. The circuit of claim 11 further comprising:
    a) at least one reverse bias source coupled to the plurality of D1 level diodes so as to allow selective reverse biasing of the plurality of D1 level diodes; and
    b) at least one reverse bias source coupled to the plurality of D4 level diodes so as to allow selective reverse biasing of the plurality of D4 level diodes.

14. The circuit of claim 13 wherein each second biasing source comprises a pin electronics driver and a backmatch resistor.

15. The circuit of claim 14 wherein each of the second biasing sources is capable of reversing biasing a D4 level diode of a non-selected channel.

16. The circuit of claim 1 wherein the switching matrix comprises:
    a) a plurality of PIN diodes comprising a D1 level coupled in parallel to the central resource;
    b) a plurality of PIN diodes comprising a D2 level, the plurality of PIN diodes of the D2 level comprising a plurality of groups comprising parallel coupled PIN diodes, each of the plurality of D1 level diodes being coupled to a different one of the groups of parallel coupled PIN diodes;

c) a plurality of PIN diodes comprising a D3 level, the plurality of PIN diodes of the D3 level comprising a plurality of groups comprising parallel coupled PIN diodes, each of the plurality of D2 level diodes being coupled to a different one of the groups of parallel coupled PIN diodes of the D3 level; and d) a plurality of PIN diodes comprising a D4 level, the plurality of PIN diodes of the D4 level comprising a plurality of groups comprising parallel coupled PIN diodes, each of the plurality of D3 level diodes being coupled to a different one of the groups of parallel coupled PIN diodes of the D4 level.

17. The circuit of claim 16 further comprising:
a) at least one reverse bias source coupled to the plurality of D1 level diodes so as to allow selective reverse biasing of the plurality of D1 level diodes; and
b) at least one reverse bias source coupled to the plurality of D4 level diodes so as to allow selective reverse biasing of the plurality of D4 level diodes.

18. The circuit of claim 16 further comprising:
a) a plurality of switches providing switchable coupling to the third biasing source at each node between the D2 level PIN diodes and the respective coupled group of D3 level diodes; and
b) each of the plurality of D1 level diodes being coupled to the same first biasing source, and wherein each of the plurality of D4 level diodes is coupled to a different second biasing source.

19. The circuit of claim 18 wherein the second biasing source comprises a pin electronics driver and a backmatch resistor.

20. The circuit of claim 18 wherein the plurality of diodes of the D1 level and the plurality of diodes of the D2 level are forward connected from the first biasing source to the third biasing source, and wherein the plurality of the D3 level and the plurality of diodes of the D4 level are forward connected from the second biasing source to the third biasing source.

21. The circuit of claim 18 further comprising:
a) at least one reverse bias source coupled to the plurality of D1 level diodes so as to allow selective reverse biasing of the plurality of D1 level diodes; and
b) at least one reverse bias source coupled to the plurality of D4 level diodes so as to allow selective reverse biasing of the plurality of D4 level diodes.

22. The circuit of claim 21 wherein the second biasing source comprises a pin electronics driver and a backmatch resistor.

23. A circuit for a multi-channel tester comprising:
a) a plurality of PIN diodes coupled to form a switching matrix configured so as to be capable of coupling a central resource to a plurality of output pins, the switching matrix comprising:
   (i) a first plurality of parallel coupled PIN diodes capable of being coupled to the central resource;
   (ii) a second plurality of PIN diodes comprising groups of parallel coupled PIN diodes, each of the PIN diodes of the first plurality of parallel coupled PIN diodes being coupled in series to a different one of the groups of diodes;
   (iii) a third plurality of PIN diodes comprising groups of parallel coupled PIN diodes, each of the PIN diodes of the second plurality of PIN diodes being coupled in series to a different one of the groups of parallel coupled PIN diodes of the third plurality of PIN diodes; and
   (iv) a fourth plurality of PIN diodes comprising groups of parallel coupled PIN diodes, each of the PIN diodes of the third plurality of PIN diodes being coupled in series to a different one of the groups of parallel coupled PIN diodes of the fourth plurality of PIN diodes;
b) a first bias source coupled to the first plurality of parallel coupled PIN diodes;
c) a plurality of second bias sources, each of the plurality of second bias sources being couple adjacent a respective one of the plurality of output pins;
d) a third bias source coupled via a plurality of solid state switches to the switching matrix; and
e) wherein the switching matrix is constructed in a half-bridge configuration such that the first current source, a selected one of the second bias sources, and the third bias source via a selected solid state switch are capable of forward biasing selected PIN diodes so as to be capable of selectively forming a channel from the central resource to each of the plurality of output pins.

24. The circuit of claim 23 wherein the first plurality of PIN diodes and the second plurality of PIN diodes are disposed in the circuit proximate to the central resource, and wherein the third plurality of PIN diodes and the fourth plurality of PIN diodes are disposed in the circuit proximate to respective ones of the plurality of output pins.

25. The circuit of claim 24 wherein the first plurality PIN diodes are forward connected from the first bias source to the second plurality of PIN diodes, and wherein the second plurality of PIN diodes are forward connected from the first plurality of PIN diodes to the plurality of solid state switches, and wherein the fourth plurality of PIN diodes are forward connected from the plurality of output pins to the third plurality of PIN diodes, and wherein the third plurality of PIN diodes are forward connected from the fourth plurality of PIN diodes to the plurality of solid state switches.

26. The circuit of claim 23 wherein the first bias source comprises a first current source coupled to the first plurality of parallel coupled PIN diodes, wherein the plurality of second bias sources comprises a plurality of pin electronics drivers, each pin electronics-driver being coupled adjacent the respective one of the plurality of output pins, and wherein the third bias source comprises a second current source coupled via the plurality of solid state switches to the switching matrix.

27. The circuit of claim 26 wherein each of the plurality of pin electronics drivers comprise a voltage source and a backmatch resistor.

28. The circuit of claim 27 wherein the first plurality of PIN diodes and the second plurality of PIN diodes are disposed in the circuit proximate to the central resource, and wherein the third plurality of PIN diodes and the fourth plurality of PIN diodes are disposed in the circuit proximate to respective ones of the plurality of output pins.

29. The circuit of claim 26 further comprising at least one fourth bias source coupled to the switching matrix so as to be capable of reverse biasing selected ones the of the first plurality of parallel coupled PIN diodes.

30. The circuit of claim 29 further comprising at least one fifth bias source coupled to the switching matrix so as to be capable of reverse biasing selected ones of the third plurality of PIN diodes.

31. The circuit of claim 30 wherein the at least one fifth bias source is coupled between each of the third plurality of PIN diodes and the fourth plurality of PIN diodes.

32. The circuit of claim 31 wherein the first plurality of PIN diodes and the second plurality of PIN diodes are disposed in the circuit proximate to the central resource, and wherein the third plurality of PIN diodes and the fourth plurality of PIN diodes are disposed in the circuit proximate to respective ones of the plurality of output pins.

33. The circuit of claim 23 wherein the first plurality PIN diodes are forward connected from the first bias source to the second plurality of PIN diodes, and wherein the second plurality of PIN diodes are forward connected from the first plurality of PIN diodes to the plurality of solid state switches, and wherein the fourth plurality of PIN diodes are forward connected from the plurality of output pins to the third plurality of PIN diodes, and wherein the third plurality of PIN diodes are forward connected from the fourth plurality of PIN diodes to the plurality of solid state switches.

34. An automated multi-channel tester comprising:
   a) a central resource;
   b) a plurality of outputs; and
   c) a switching matrix coupling the central resource to the plurality of outputs via a plurality of selectable channels, each of the channels comprising:
      (i) PIN diodes coupled in a half-bridge configuration having a central resource coupled end, an output coupled end, and a common node; and
      (ii) a first, a second, and a third biasing source for forward biasing the PIN diodes, the first and second biasing sources being coupled to the central resource coupled end and the output coupled end of the half-bridge, respectively, the third biasing source being coupled to the common node, the first and second biasing sources being constructed to provide substantially balanced outputs and such that the sum of the outputs of the first and second biasing sources are substantially balanced with respect to the output of the third bias source.

35. The tester of claim 34 wherein each of the plurality of selectable channels comprises:
   a) at least two series connected PIN diodes coupled to the central resource adjacent the central resource; and
   b) at least two series connected PIN diodes coupled adjacent the output coupled end of each of the plurality of selectable channels.

36. The tester of claim 34 wherein the first, the second, and the third biasing sources are coupled to the switching matrix so as to be capable of forward bias the PIN diodes, the first biasing source comprising a first current source, the second biasing source comprising a plurality of pin electronics drivers, each pin electronics driver being couple adjacent a respective one of a plurality of output pins, the third biasing source comprising a second current source coupled via a plurality of solid state switches to the switching matrix, and wherein the switching matrix is constructed so as to be capable of selectively forming a channel from the central resource to each of the plurality of output pins.

37. The tester of claim 36 further comprising a fourth bias source coupled to the switching matrix so as to be capable of reverse biasing selected PIN diodes of non-selected channels.

38. The tester of claim 36 wherein each of the plurality of selectable channels comprises:
   a) at least two series connected PIN diodes coupled to the central resource adjacent the central resource; and
   b) at least two series connected PIN diodes coupled adjacent the output coupled end of each of the selectable channels.

* * * * *

UNITED STATES PATENT AND TRADEMARK OFFICE
Certificate

Patent No. 6,566,890 B2            Patented: May 20, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Steven Hauptman, Camarillo, CA (US); and Alan Hussey, Oak Park, CA (US).

Signed and Sealed this Seventeenth Day of July 2007.

ANDREW H. HIRSHFELD
*Supervisory Patent Examiner*
Art Unit 2858